US011592954B2

(12) United States Patent
List

(10) Patent No.: US 11,592,954 B2
(45) Date of Patent: Feb. 28, 2023

(54) FLOATING EDITABLE GRAPHICAL OVERLAY INCLUDING 3D MODEL OBJECT PROPERTIES

(71) Applicant: Hexagon Technology Center GmbH, Heerbrugg (CH)

(72) Inventor: Christian List, Madison, AL (US)

(73) Assignee: Hexagon Technology Center GmbH, Heerbrugg (CH)

(*) Notice: Subject to any disclaimer, the term of this patent is extended or adjusted under 35 U.S.C. 154(b) by 154 days.

(21) Appl. No.: 17/078,974

(22) Filed: Oct. 23, 2020

(65) Prior Publication Data
US 2022/0129138 A1 Apr. 28, 2022

(51) Int. Cl.
*G06F 30/13* (2020.01)
*G06F 3/04815* (2022.01)
*G06F 16/51* (2019.01)
*G06F 16/54* (2019.01)
*G06F 30/12* (2020.01)
(Continued)

(52) U.S. Cl.
CPC ........ *G06F 3/04815* (2013.01); *G06F 3/0482* (2013.01); *G06F 3/04845* (2013.01); *G06F 16/51* (2019.01); *G06F 16/54* (2019.01); *G06F 30/12* (2020.01); *G06F 30/13* (2020.01); *G06F 2203/04803* (2013.01)

(58) Field of Classification Search
CPC .............. G06F 3/04845; G06F 3/0482; G06F 3/04815; G06F 16/51; G06F 16/54; G06F 30/12; G06F 30/13
See application file for complete search history.

(56) References Cited

U.S. PATENT DOCUMENTS 5,195,172 A * 3/1993 Elad ................. G06N 5/003
706/53
5,623,591 A * 4/1997 Cseri ................ G06F 9/451
715/209
(Continued)

OTHER PUBLICATIONS

AEC Software Technology, "Using Quick Properties to Edit Points in AutoCAD Civil 3D," published on Aug. 27, 2012, YouTube.com, video, 2 minutes 35 seconds, available at https://youtu.be/xCI9MNIKr7g (Year: 2012).*
(Continued)

*Primary Examiner* — Dino Kujundzic
(74) *Attorney, Agent, or Firm* — Nutter McClennen & Fish LLP

(57) ABSTRACT

A method edits a property value of a model object for a large-scale capital project. The method displays a 3D model of the large-scale capital project in a graphical user interface. The 3D model has a plurality of model objects. The method selects one or more model objects in the graphical user interface, thereby defining one or more selected model objects. The method also selects one or more properties of the selected model object to view in a graphical overlay, thereby defining one or more selected properties. The method also generates a graphical overlay adjacent to or over each of the one or more selected model objects. The graphical overlay includes values for the one or more selected properties. The method modifies a value of the one or more selected properties in the graphical overlay, thereby defining a modified property value.

20 Claims, 16 Drawing Sheets
(12 of 16 Drawing Sheet(s) Filed in Color)

(51) Int. Cl.
*G06F 3/0482* (2013.01)
*G06F 3/04845* (2022.01)

(56) References Cited

U.S. PATENT DOCUMENTS

| | | | | |
|---|---|---|---|---|
| 10,002,164 | B2* | 6/2018 | Jarvis | G06F 16/24575 |
| 2005/0209831 | A1* | 9/2005 | Jungreis | G06F 30/13 |
| | | | | 703/1 |
| 2007/0013709 | A1* | 1/2007 | Charles | G06T 19/20 |
| | | | | 345/581 |
| 2007/0174027 | A1* | 7/2007 | Moiseyev | G06F 30/13 |
| | | | | 703/1 |
| 2008/0062167 | A1* | 3/2008 | Boggs | G06T 19/00 |
| | | | | 345/419 |
| 2009/0217200 | A1* | 8/2009 | Hammack | G06F 8/34 |
| | | | | 715/810 |
| 2009/0273598 | A1* | 11/2009 | Reghetti | G06T 19/00 |
| | | | | 345/419 |
| 2010/0318929 | A1* | 12/2010 | Hilton | G06T 11/60 |
| | | | | 715/848 |
| 2011/0098985 | A1* | 4/2011 | Lawson | G06F 30/13 |
| | | | | 703/1 |
| 2015/0199093 | A1* | 7/2015 | Kuscher | G06F 3/0486 |
| | | | | 715/788 |

OTHER PUBLICATIONS

Cadalyst Videos, "AutoCAD Tip—Super Quick Properties (Lynn Allen/Cadalyst Magazine)," published on Apr. 11, 2012, YouTube.com, video, 3 minutes 29 seconds, available at https://youtu.be/h8dEmcD6L-4 (Year: 2012).*

Tutorials Point (India) Ltd., "AutoCAD—Change object properties," published on Apr. 16, 2018, YouTube.com, video, 5 minutes 21 seconds, available at https://youtu.be/jGds8tpxMrl (Year: 2018).*

* cited by examiner

FLOATING EDITABLE GRAPHICAL OVERLAY INCLUDING 3D MODEL OBJECT PROPERTIES

FIELD OF THE INVENTION

Various embodiments of the invention generally relate to large-scale capital projects and, more particularly, various embodiments relate to a graphical user interface for 3D models of large-scale capital projects.

BACKGROUND OF THE INVENTION

Design, construction, and management of large-scale building and civil infrastructure capital projects, such as plants, ships, offshore platforms and mines. Large-scale capital projects, require coordination of processes and configuration data on a scale that is orders of magnitude greater than those of smaller, common projects (e.g., building and selling a ten room house). Large-scale capital projects consequently often require a substantially more comprehensive production and management solution.

In response to this need, those skilled in the art have developed comprehensive building and civil infrastructure design programs that are specially configured for the rigors of such large capital projects. Among other things, this type of building and civil infrastructure design program can be implemented as a broad application suite that manages most or all phases of a large-scale capital project, from initial conception, to design, construction, handover, maintenance, management, and decommissioning.

SUMMARY OF VARIOUS EMBODIMENTS

In accordance with one embodiment of the invention, a method manages one or more properties of one or more model objects for a large-scale capital project. The 3D model has a plurality of model objects. The method receives a selection of one or more model objects in the graphical user interface, thereby defining one or more selected model objects. The method also receives one or more properties of the selected model object to view in a graphical overlay, thereby defining one or more selected properties. The method also directs generation of a graphical overlay in a graphical user interface that displays a 3D model of the large-scale capital project. The overlay is generated adjacent to or over each of the one or more selected model objects in the 3D model. The graphical overlay includes values for the one or more selected properties. The method modifies a value of the one or more selected properties in the graphical overlay, thereby defining a modified property value.

The method may display a 3D model of the large-scale capital project in a graphical user interface. The method then optionally propagates the modified property value to a database containing the values for the properties of the model objects. In some embodiments, the modified property value is propagated if the property is an object type property. Additionally, if the modified property is an object instance property, the modified property value may not be propagated.

In various embodiments, the graphical overlay may be moved to a different location within the 3D model by a user input. For example, a user may drag and drop the graphical overlay to a new position. The method may select additional properties to view after generating the graphical overlay. Furthermore, the method may display, in response to the selecting, additional properties in the graphical overlay.

Some embodiments may display a plurality of graphical overlays. For example, a respective graphical overlay may be displayed for each selected object.

In various embodiments, a user input within the 3D model may select the one or more model objects. In a similar manner, selecting the one or more properties of the selected model object to view in a graphical overlay may be made by a user input, for example, in a property selection window. However, the property selection window may be displayed outside of the 3D model window within the user interface.

In some embodiments, the properties displayed in the graphical overlay are a function of the selecting one or more properties in the property selection window. Furthermore, each one of the graphical overlays may take up a smaller amount of 2D area of the user interface than the property selection window. To that end, the graphical overlay may only display the properties selected from the property selection window.

In accordance with another embodiment, a system for editing properties of a model object in a graphical user interface includes a 3D model engine configured to communicate with a model object database. The model object database contains information relating to model objects from a model representing a capital project. The information includes at least one model object property for each of the model objects. The 3D model engine is further configured to direct a graphical user interface to display the model objects in a three-dimensional model. The system also includes a graphical overlay engine configured to generate a graphical overlay in the three-dimensional model. The graphical overlay is positioned over or adjacent to each of the one or more selected model objects, and includes values for the one or more selected properties. The properties are directly editable in the graphical overlay. The system further includes an input configured to receive a selection of one or more of the model objects and one or more properties to display for the one or more of the model objects. The system also has a property propagation engine configured to receive a property changed in the graphical overlay and to propagate that change to the model object database.

In some embodiments, the graphical overlay engine is configured to generate a plurality of graphical overlays. Each of the graphical overlays is associated with a selected model object. A property selection window may receive the selection of one or more properties to display. The graphical overlay engine may adjust the one or more properties displayed as a function of receiving the selection of the one or more of the model objects. In some embodiments, the selection of the one or more model objects is configured to be made via a user selection in the three-dimensional model.

Illustrative embodiments of the invention are implemented as a computer program product having a computer usable medium with computer readable program code thereon. The computer readable code may be read and utilized by a computer system in accordance with conventional processes.

BRIEF DESCRIPTION OF THE DRAWINGS

The patent or application file contains at least one drawing executed in color. Copies of this patent with color drawing(s) will be provided by the Patent and Trademark Office upon request and payment of necessary fee.

Those skilled in the art should more fully appreciate advantages of various embodiments of the invention from the following "Description of Illustrative Embodiments," discussed with reference to the drawings summarized immediately below.

FIGS. 8A-8B schematically show a list of properties that may be used in accordance with illustrative embodiments of the invention.

DESCRIPTION OF ILLUSTRATIVE EMBODIMENTS

Illustrative embodiments provide an improved graphical user interface for 3D models of large-scale capital projects. Large-scale capital projects have an enormous number of interconnected objects, and generally require large computer processing power for viewing the 3D model. In prior art, model objects are selected and then properties are displayed and/or edited in a separate panel. Illustrative embodiments provide a graphical overlay (also referred to as a window) in the 3D model view over, or adjacent to, one or more selected model objects. The overlay may display one or more selected properties for a plurality of selected model objects. Additionally, the properties may be edited in the overlay itself and propagated throughout the entire model. Details of illustrative embodiments are discussed below.

Figure 1A:
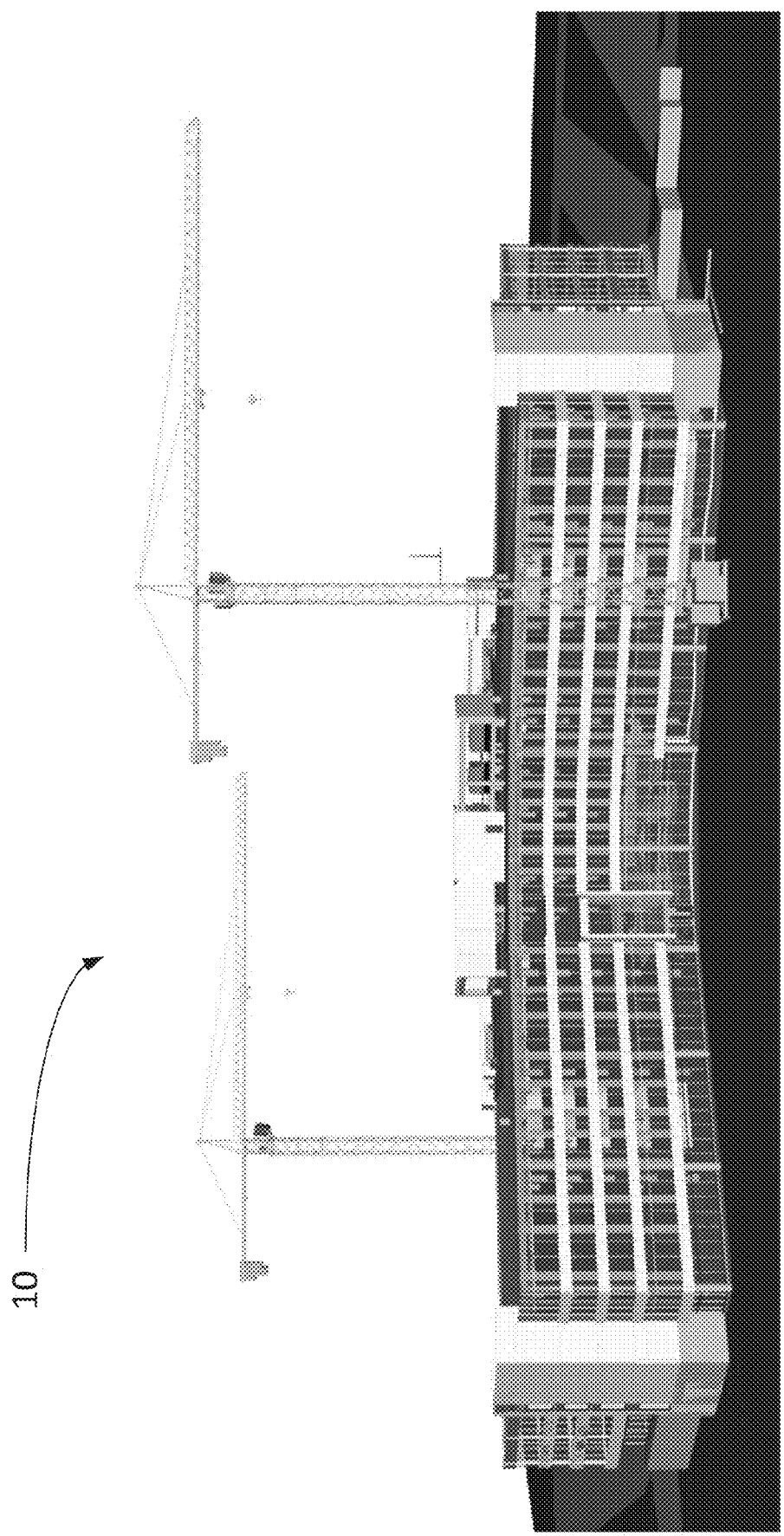
FIG. 1A schematically shows a part of a model of a large-scale capital project in accordance with illustrative embodiments of the invention.

FIG. 1A generally shows one example of a large-scale capital project 10 (also referred to as "capital project 10") that may implement illustrative embodiments of the invention. More specifically, as known by those skilled in the art, the capital project 10 generally is a long-term investment made to build, augment, add, or improve on a highly capital intensive project—it requires notable amounts of both financial capital and labor capital to undertake, and often takes years to complete. Capital projects 10 are often defined by their large-scale cost relative to other investments requiring less planning and resources (e.g., building a house or a truck). Both the private sector and public sector can be involved in the capital project 10. Some examples of capital projects 10 include developing and maintaining airports, hospitals, tall buildings, bridges & tunnel, and road projects. Additionally, or alternatively, illustrative embodiments may be used with oil refineries, power plants, ships, offshore oil platforms, dams, and factories.

Figure 1B:
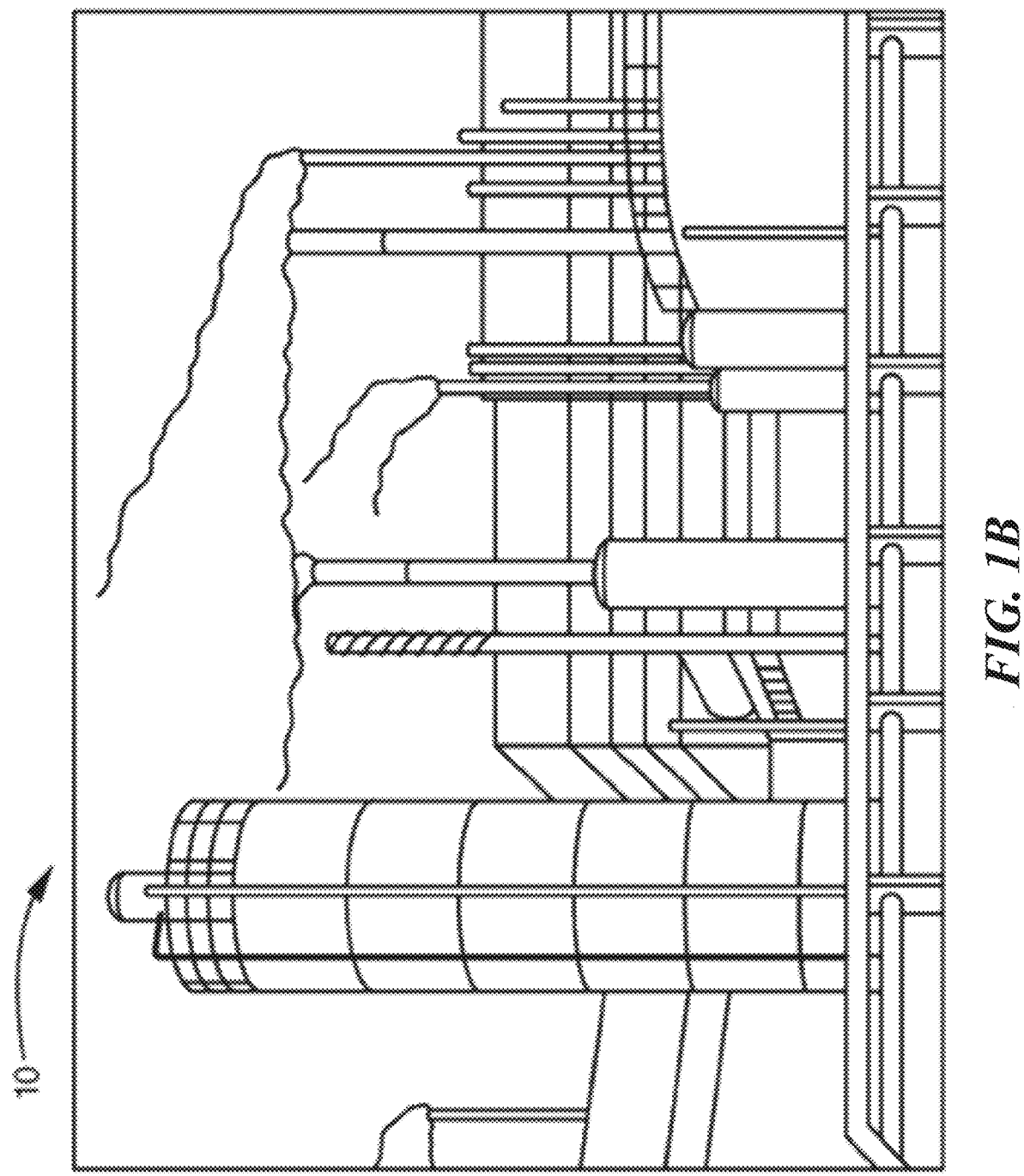
FIG. 1B schematically shows a power plant, which, as known by those skilled in the art, has an enormous number of different components that cooperate to accomplish its function of generating power.

Illustrative embodiments of the invention may be advantageously used with a variety of types of capital projects 10. FIG. 1B schematically shows a power plant, which, as known by those skilled in the art, has an enormous number of different components that cooperate to accomplish its function of generating power. For example, among other things, the power plant of this figure has a plurality of large and small buildings, smokestacks, pipes, valves, fuel tanks, ladders, and electrical systems. The capital project 10 shown in FIG. 1B is provided for the sake of showing a variety of large-scale capital projects that may benefit from illustrative embodiments of the invention, and illustrative embodiments are not intended to be limited thereto.

Figure 1C:
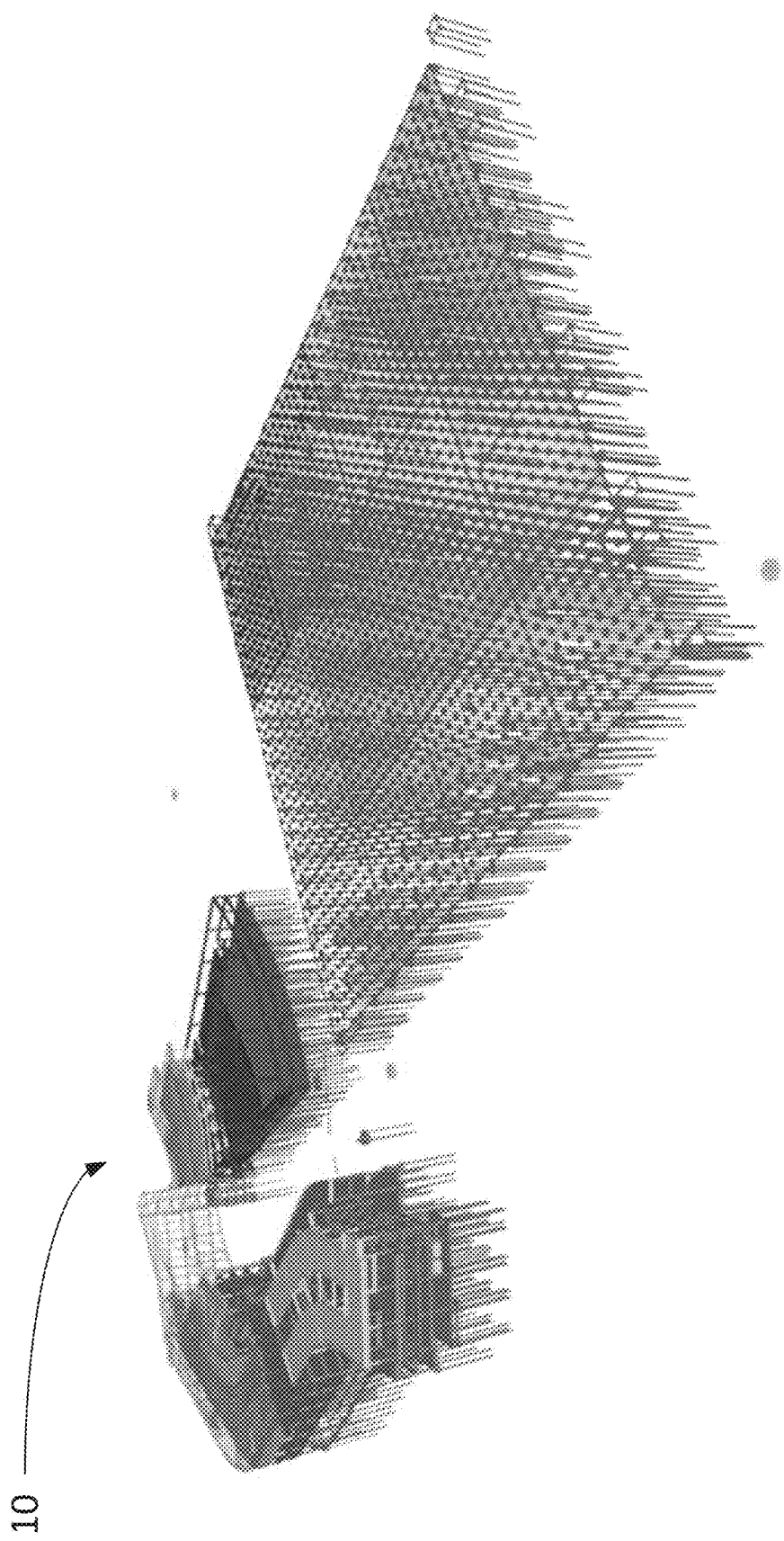
FIG. 1C shows a layer view of an alternative large-scale construction project in accordance with illustrative embodiments of the invention.

FIG. 1C shows a layer view of an alternative large-scale construction project 10. In a manner similar to FIGS. 1A and 1B, the project 10 requires a large number of resources, materials, and may include multiple buildings. Designing, building, and maintaining the large-scale capital projects 10 requires vast amounts of planning and coordination. A large number of components must be properly positioned, oriented, and connected with other components in accordance with a projected schedule and budget. Without careful planning and coordination, the large-scale capital project 10 may never have been built or operated.

To that end, those skilled in the art have developed plant design programs/products ("plant design programs") to assist in planning/designing, developing, maintaining, and decommissioning capital projects 10, such as those shown in FIGS. 1A-1C. Examples of widely used building & infrastructure design program include BricsCAD® and/or plant design program is known as the SmartPlant® Enterprise product (hereinafter "SmartPlant® product"), distributed by Hexagon PPM of Huntsville, Ala. In a manner similar to other such products, the above-noted modeling products have at least the following interrelated functions and components:

3D modeling and visualization,
    engineering and schematics,
    information management,
    procurement, fabrication, and construction,
    open integration with other proprietary and open systems.

Accordingly, architects, designers, engineers, developers, managers and other relevant parties use these and other features of design programs, such as the SmartBuild® and SmartPlant® products, to design, build, update, manage, and decommission capital projects 10, such as the buildings 10 shown in FIGS. 1A-1C. As known by those skilled in the art, such 3D or 2D design programs often produce a template that, along with multiple software tools, serves as a principal mechanism for designing and managing their projects. Additionally, these design object may include associated multi-dimensional information such as documents, logistics objects, metadata, and other information. Among other things, the template typically includes a plurality of options, configurations, and layouts that permit the user to more accurately and efficiently develop their project.

At the risk of oversimplifying various embodiments, one may analogize a template used in the large-scale capital project context to a word processing template that is displayed when a user opens a word processing program. Among other things, a word processing template may be configured to enable a user to select from multiple fonts, colors, shapes, line spacing, and formats. The user then begins preparing their document using the different options that the template provides. In fact, the word processing user can make any of a wide variety of different documents, such as a letter, a memo, a spreadsheet, a book, etc. In a similar manner, a template used for the capital project 10 also can be used with other, vastly different types of capital projects, such as those capital projects 10 noted above.

The configuration data of the template, however, often changes throughout the life cycle of the capital projects 10. Specifically, the template configuration required for the lifecycle of a capital project 10, such as the power plant of FIG. 1B, an oil refinery, or a ship, depends on many factors, including the needs of the owner, the specifics of the industry, and the available configuration options afforded by the software system being used at the various project site(s) 16. Configuration of such capital projects 10 typically includes thousands of types of objects, each including custom properties, symbols, drawing templates, rules, etc. In addition, configuration requirements typically differ between the various lifecycle stages of the facility, such as between conceptual design, detailed design, commissioning, construction, operations, maintenance, decommissioning, etc.

Another level of complexity relates to the various software applications used at each project site. In particular, each software application executing at a project site may have its own set of configuration types and options, and specific methods to compare and update the configuration data, as well as the existing design data. In addition, these options and methods may change or depend on the specific version of the software applications. Yet another level of complexity involves an integrated system of applications, and the interdependence between the configuration types and the software applications.

Given these complexities, a building owner, plant owner or engineering company can easily spend years developing a complete set of template configurations to use with their design program. Indeed, the inventors believe that such complexities are a leading cause for extended delays in project completion and massive cost overruns. Data from a McKinsey analysis on Capital Projects and Infrastructure, June 2016, shows that large capital projects are delayed by twenty months, on average, and have an 80% cost overrun.

Figure 2:
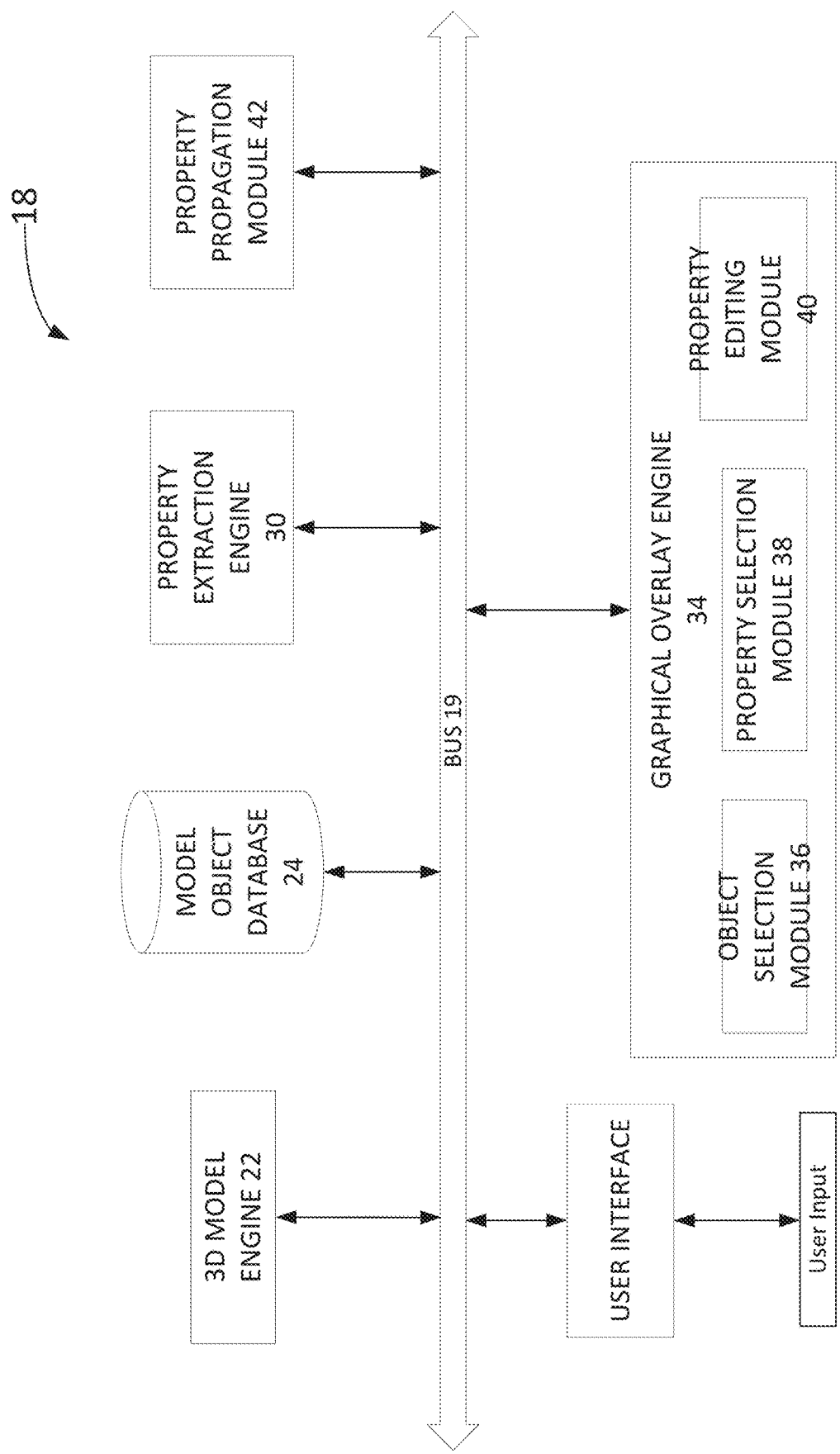
FIG. 2 schematically shows a system configured to generate floating editable property windows (referred to as a graphical overlay) for one or more model objects in a 3D model in accordance with illustrative embodiments of the invention.
Figure 2:
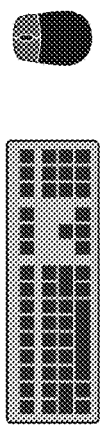

In addition to the inherent difficulties of completing large-scale capital projects 10, the 3D model for each capital project 10 has a large number of associated parts (i.e. model objects), and each object has a large number of associated properties. Prior art methods make it difficult to check object properties, and furthermore make it difficult to quickly fix any problems that are found with the object properties. Illustrative embodiments advantageously provide a simplified graphical user interface that allows the capital project 10 planners, among others, to easily view and adjust properties for one or more objects of the project 10 in the 3D model. As an additional advantage, any problems may be immediately fixed directly in the 3D graphics view FIG. 2 schematically shows a system 18 configured to generate floating editable property windows (referred to as a graphical overlay) for one or more model objects in a 3D model in accordance with illustrative embodiments of the invention.

The system 18 includes a user interface 20 configured to control a graphical user interface through which the 3D model may be displayed to a user. To that end, a 3D model engine 22 is configured to generate and/or edit the 3D model. In preferred embodiments, the 3D model is a large-scale capital project 10. Accordingly, the 3D model engine 22 may be referred to as a 3D large-scale capital model engine 22. The 3D model engine 22 may include, among other things, design programs, such as the SmartBuild® and SmartPlant® products described previously.

Information relating to the plurality of model objects in the 3D model may be stored in the model object database 24. The model object database 24 may include graphical data relating to the shape and size, among other things, of various model objects. Additionally, the database 24 may have information relating to how various model objects are coupled together. The model object database 24 may further include one or more properties for each of the model objects.

In some cases, the 3D model may be imported into the system 18. The system 18 may therefore include a property extraction engine 30 configured to extract properties (e.g., type properties and/or instance properties) from model objects. A type property is a property that is generic to many instances of the model object. An instance property is a property that is specific to a particular instance of the model object. The model object typically has a 3D geometry and other required properties. The property extraction engine 30 has a 3D model interface configured to receive the 3D model. Accordingly, the property extraction engine 30 may communicate with a respective third-party program, and extract model object properties therefrom. For example, the 3D model interface may communicate with a building information modeling platform (e.g., Revit), where the architects and/or engineers have created the 3D model objects with associated properties and properties. The property extraction engine 30 may extract the properties from the model objects and store them in the model object database 24.

Some of the model objects may be input to the system 18 without any properties, with only type properties, with only instance properties, and/or with incorrect properties. Thus, in some cases, it may be desirable to edit the property/property codes. Illustrative embodiments advantageously allow users to inspect and edit property codes within the 3D model interface itself. To that end, the graphical overlay engine 34 includes an object selection module 36 that allows the user to select one or more of the model objects.

The object selection module 36 communicates with the 3D model and/or the 3D model engine 22 to display a respective graphical overlay (e.g., an adorner) on top of, next to, and/or adjacent to each of the one or more of the selected model objects in the 3D model. To that end, the object selection module 36 iterates through the selected objects to determine where in 3D space they are located, and transforms that into a 2D screen position to display the graphical overlay at a specific location on the screen. In illustrative embodiments, that location may be partially or completely over the model object, closest to the model object rather than any other model object, and/or may include a reference line showing the association between model object and overlay.

The graphical overlay engine 34 also includes a property selection module 38 that allows a user to select the properties that are to be displayed in the graphical overlay. The property selection module 38 may communicate with the user interface 20 and present a button in a property list to add/remove a property.

The overlay engine 34 also includes a property editing module 40 configured to allow a user input to edit one or more properties displayed by the property selection module 38. The user may edit the property in the 3D model itself, i.e., in the graphical overlay shown in the 3D model. The property editing module 40 communications with a property propagation module 42 that receives the change to the property (e.g., revision or newly added property value). The property propagation module 42 propagates the revised property value to all of the other property values for the same model object. Accordingly, users may easily review and revise property values conveniently within the 3D model.

Each of the above-described components is operatively connected by any conventional interconnect mechanism. FIG. 2 simply shows a bus 19 communicating each of the components. Those skilled in the art should understand that this generalized representation can be modified to include other conventional direct or indirect connections. Accordingly, discussion of a bus is not intended to limit various embodiments.

Indeed, it should be noted that FIG. 2 only schematically shows each of these components. Those skilled in the art should understand that each of these components can be implemented in a variety of conventional manners, such as by using hardware, software, or a combination of hardware and software, across one or more other functional components. For example, the graphical overlay engine 34 may be implemented using a plurality of microprocessors executing firmware. As another example, the property editing module 40 may be implemented using one or more application specific integrated circuits (i.e., "ASICs") and related software, or a combination of ASICs, discrete electronic components (e.g., transistors), and microprocessors. Accordingly, the representation of the object selection module 36, the property selection module 38, and the property editing module 40 shown within a single box of the graphical overlay engine 34 of FIG. 2 is for simplicity purposes only.

In fact, in some embodiments, the graphical overlay engine 34 of FIG. 2 is distributed across a plurality of different machines—not necessarily within the same housing or chassis. Additionally, in some embodiments, components shown as separate (such as the property propagation module 42, the property extraction engine, and/or the graphical overlay engine 34 in FIG. 2) may be replaced by a single component (such as a single graphical overlay engine 34). Furthermore, certain components and sub-components in FIG. 2 are optional. For example, some embodiments may not use the property extraction engine 30.

It should be reiterated that the representation of FIG. 2 is a significantly simplified representation of an actual system 18 for generating editable floating windows. Those skilled in the art should understand that such a device may have other physical and functional components, such as central processing units, other packet processing modules, and short-term memory. Accordingly, this discussion is not intended to suggest that FIG. 2 represents all of the elements of the system 18.

Figure 3:
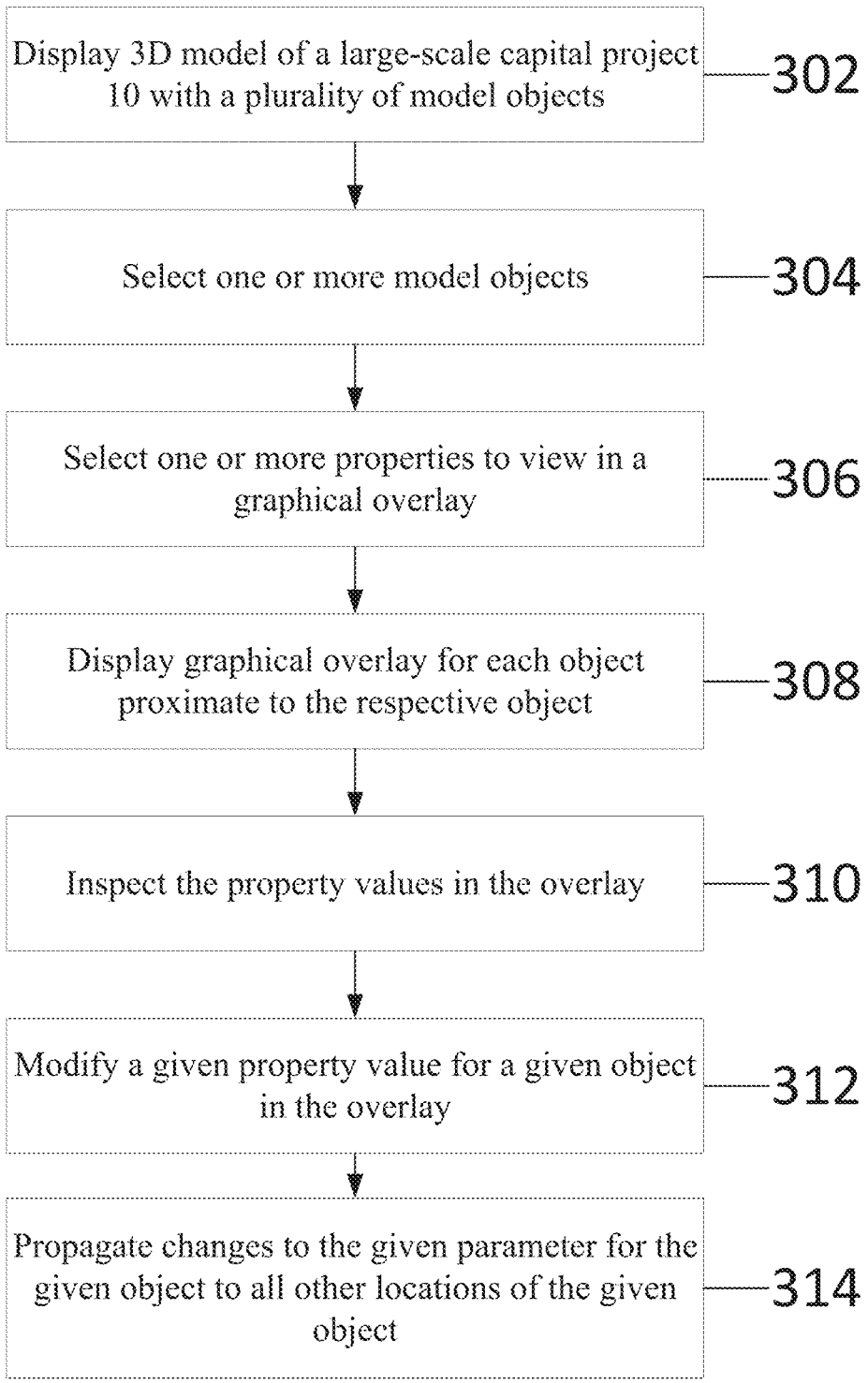
FIG. 3 shows a process of viewing model objects and editing the object properties in a 3D model in accordance with illustrative embodiments of the invention.

FIG. 3 shows a process of viewing model objects and editing the object properties in a 3D model in accordance with illustrative embodiments of the invention. Prior to the introduction of various embodiments of the process and system described herein, it was impossible to quickly visualize selected properties of model objects and edit those properties within the 3D model itself. Instead, one or more technicians manually would make reports of the properties to identify issues, and then find the problematic objects in the editable mode, then open a property page and fix the property. The inventors discovered a way to display and edit object properties intuitively displayed directly in the graphic view where the object graphics are displayed. Accordingly, illustrative embodiments advantageously provide an immediate and visual correspondence between a property value and the object to which the property applies.

It should be noted that this process can be a simplified version of a more complex process of viewing model objects and editing the object properties in a 3D model. As such, the process may have additional steps that are not discussed. In addition, some steps may be optional, performed in a different order, or in parallel with each other. Accordingly, discussion of this process is illustrative and not intended to limit various embodiments of the invention.

Figure 4:
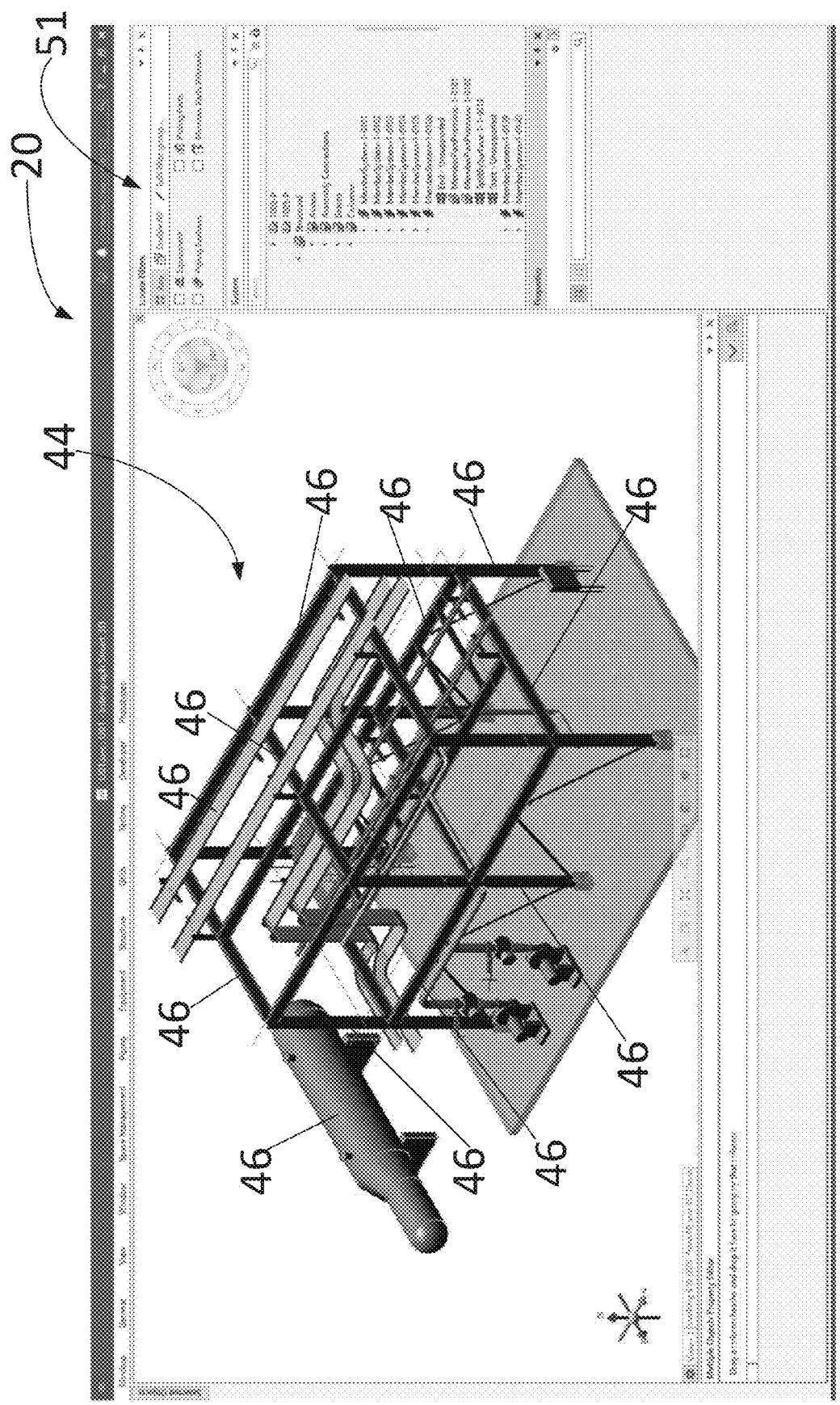
FIG. 4 shows a screenshot of a user interface including the 3D model in accordance with illustrative embodiments of the invention.

The process 300 of FIG. 3 begins at step 302, which displays the 3D model 44 of a large-scale capital project 10 with a plurality of model objects 46. To that end, the 3D model engine 22 may be used to display the large-scale capital project 10. FIG. 4 shows a screenshot of a user interface 20 including the 3D model 44 in accordance with illustrative embodiments of the invention. For the sake of convenience, not every model object 46 in the 3D model 44 has a reference numeral.

Figure 5:
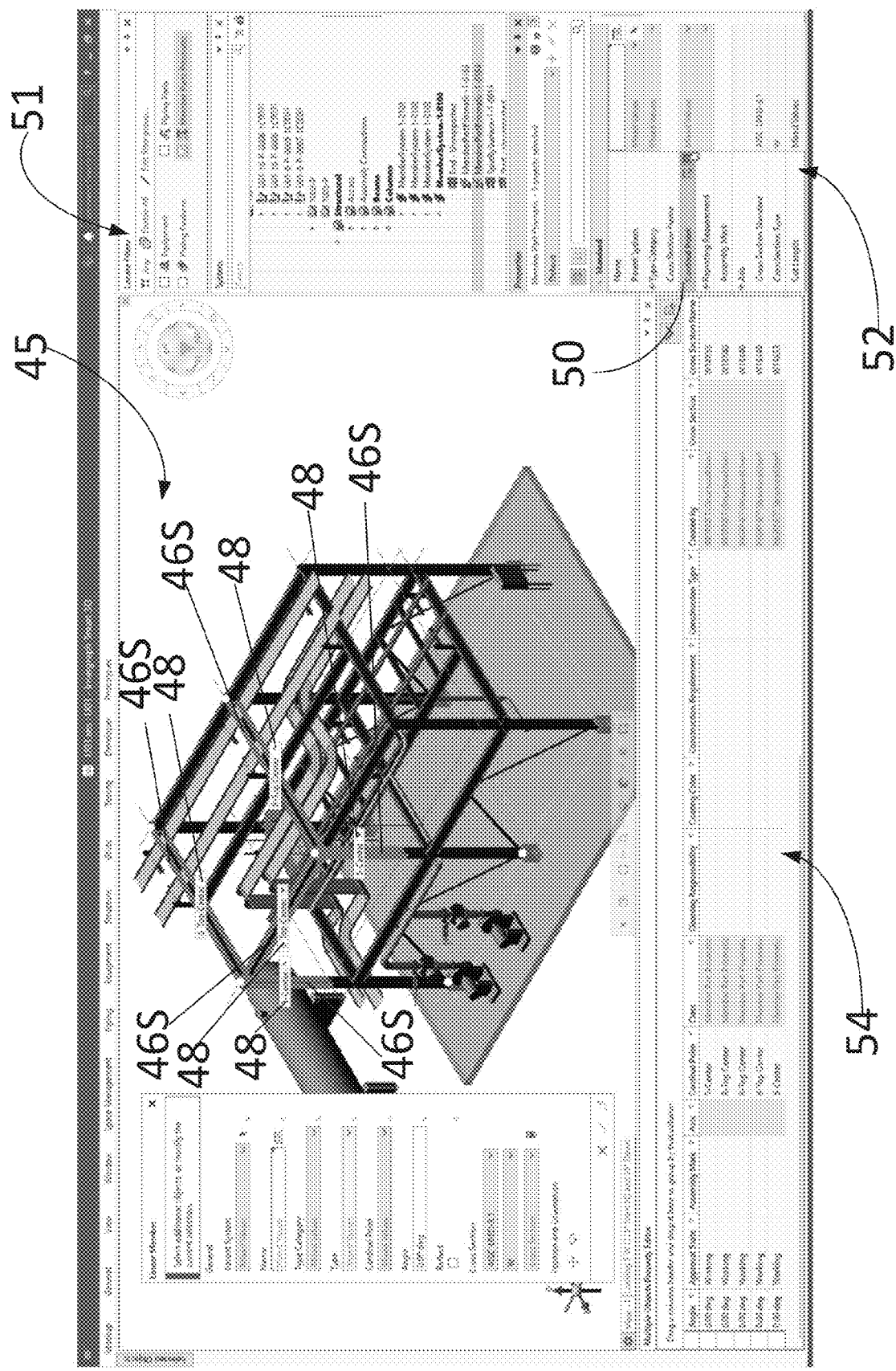
FIG. 5 shows a screenshot of the 3D model of FIG. 4 including a plurality of selected model objects and a property selection window in accordance with illustrative embodiments of the invention.

The process then proceeds to step 304, where one or more model objects 46 are selected. In illustrative embodiments, the model objects 46 may be selected by the user via the user input (e.g., by selecting the object 46 directly in the 3D model and/or a main panel 51 using the keyboard and mouse of the user input). FIG. 5 shows a screenshot of the 3D model 44 of FIG. 4 including a plurality of selected model objects 46S. Additionally, FIG. 5 shows a main panel 51 including a property selection window 52 and an object selection panel. In illustrative embodiments, the main panel 51 is not within the 3D model window 45.

The process then proceeds to step 306, which selects one or more properties to view in the graphical overlay 48 (e.g., from the property selection window 52 of FIG. 5). The property selection module 38 may communicate with the user interface 20 and present a selectable button in a property list in the property selection window 52 to add/remove a property 50.

The process may then proceed to step 308, which displays the graphical overlay 48 for each of the selected objects 46S over or proximate to the respective object. Although shown as occurring after step 306, in some embodiments, step 308 may take place after step 304, with an empty graphical overlay 48.

In illustrative embodiments, the object selection module 36 communicates with the 3D model and/or the 3D model engine 22 to display a respective graphical overlay 48 on top of, next to, and/or adjacent to each of the one or more of the selected model objects 46S in the 3D model 44. To that end, the object selection module 36 iterates through the selected objects 46S to determine where in the 3D model 44 they are located, and transforms a portion on top of and/or adjacent to the selected objects 46S into a 2D screen position to display the graphical overlay 48 at a specific location on the screen. An example of a process of determining where to display the graphical overlay 48 is described below with reference to FIG. 11.

Accordingly, each selected object 46S has an associated overlay 48. In various embodiments, the overlay 48 is closest to its associated object 46S than other model objects 46. However, in 3D models, it may be difficult, depending on view, to cover a single object 46S without covering one or more additional objects 46. In some embodiments, the selected objects 46S are additionally visually emphasized, e.g., by highlighting. Additionally, or alternatively, in some embodiments the graphical overlay 48 may be positioned along a central/middle portion of the associated object 46S to help better emphasize the associated object 46S. Furthermore, the graphical overlay 48 may be slightly offset from the associated object 46. In some embodiments, the graphical overlay 48 may include a reference line pointing to the associated object 46S.

It should be understood that the above description of the position of the overlay refers to a default positioning of the overlay(s) 48. In various embodiments, the user may manually adjust the position of the overlay 48 (e.g., by drag and drop action).

As properties 50 are selected, as described with reference to step 306, the graphical overlay 48 may become populated with the property 50 value. Additionally, the selected objects 46S and associated properties 50 may be shown in a property editor window 54, which is outside of the 3D model 44 (in a manner similar to the property selector window 52).

FIG. 5 schematically shows the overlays 48 displayed for each of the selected model objects 46S. Furthermore, each of the graphical overlays 48 displays the selected property 50 value. In the example shown, the selected property 50 is a cardinal point for each of the selected objects 46S. Accordingly, the cardinal point property 50 is displayed for each of the model objects 46S in the respective graphical overlay 48. As shown, each overlay 48 is conveniently positioned over and/or adjacent to a respective model object 46S, within the 3D model 44 and/or 3D model window 45.

Figure 6:
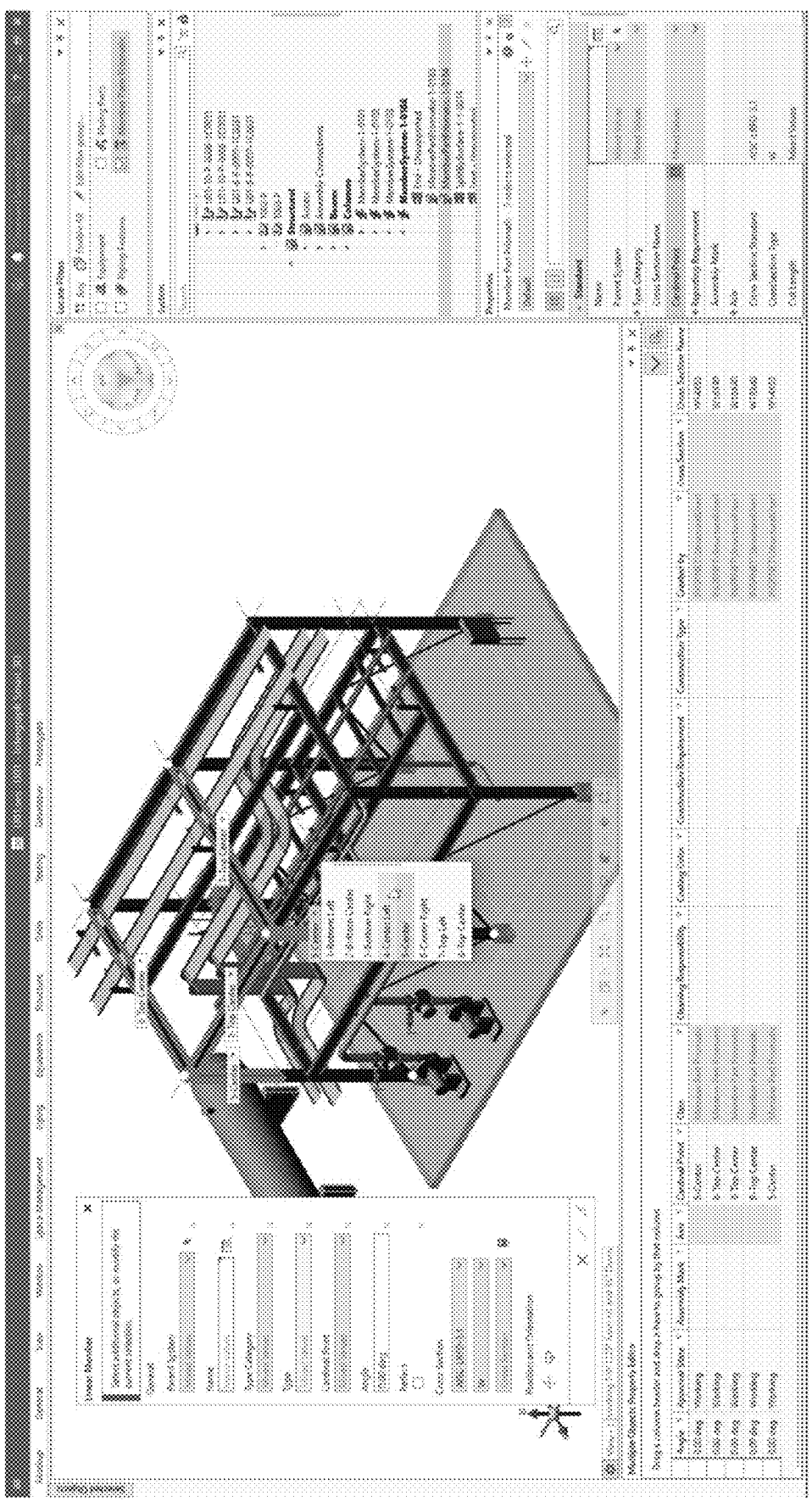
FIG. 6 shows a screenshot inspecting the selected property value in accordance with illustrative embodiments of the invention.

The process of FIG. 3 then proceeds to step 310, which inspects the property values in the graphical overlay 48. FIG. 6 shows a screenshot inspecting the selected property value in accordance with illustrative embodiments of the invention. As shown, in some embodiments, the property value may be selectable from a finite list, as in the drop-down menu. Additionally, or alternatively, some properties may have an undefined or open-ended value (e.g., a numerical value that may be inputted by the user). For the presently selected property cardinal point property 50, there are eight predefined options: (1) bottom left, (2) bottom center, (3) bottom right, (4) center left, (5) center, (6) center right, (7) top left, and (8) top center. The default property value for the model object, which may have been designated by the original 3D model designer, is (5) center. However, upon inspecting the property 50, the user may choose to change the property 50 value. Alternatively, the user may leave the property 50 as is.

Figure 7:
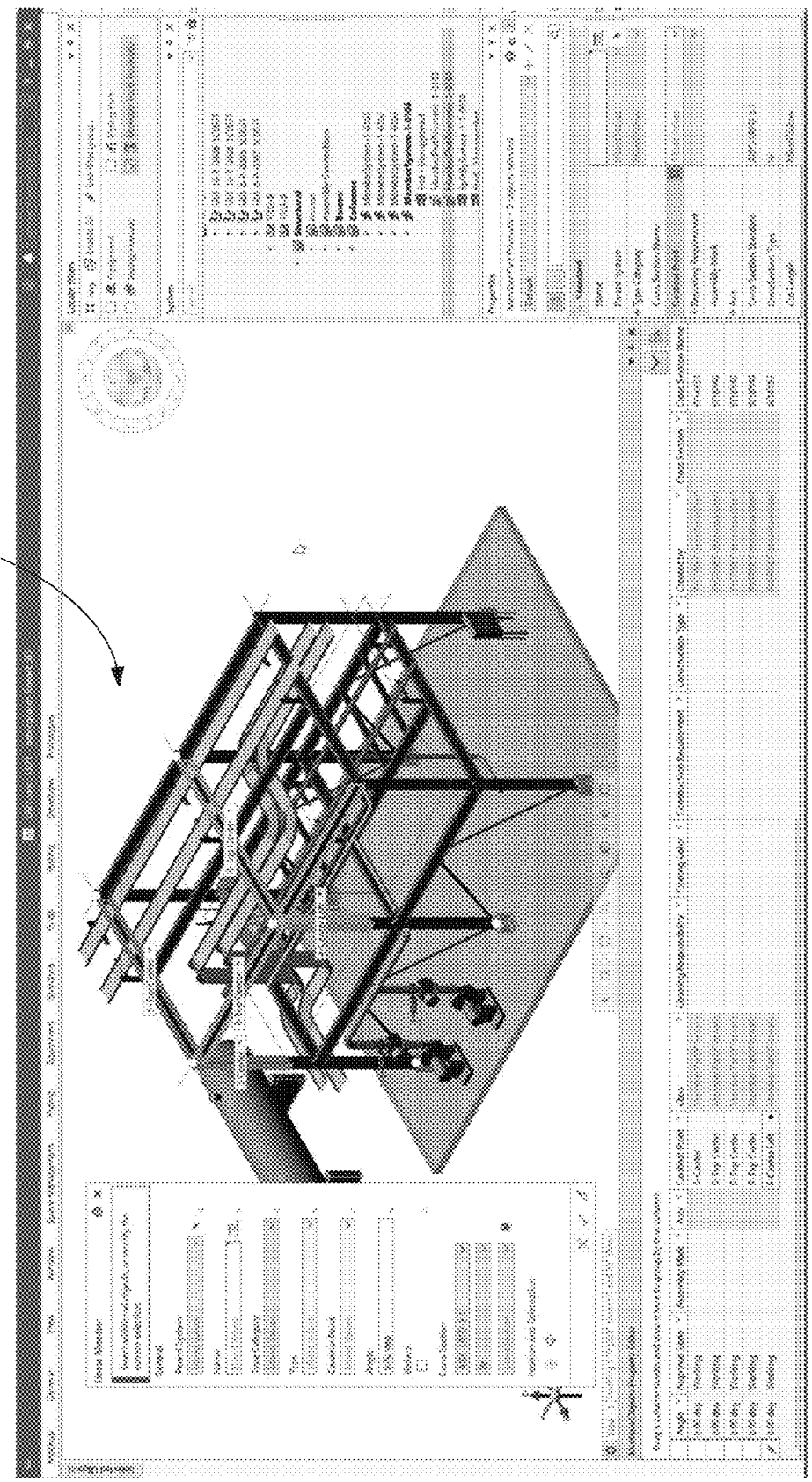
FIG. 7 shows a screenshot after the property value has changed in accordance with illustrative embodiments of the invention.

The process then proceeds to step 312, where the value for the property is modified. FIG. 7 shows a screenshot after the property 50 value has changed in accordance with illustrative embodiments of the invention. In the present example, the cardinal point property 50 value is changed from center to center left. In illustrative embodiments, the 3D model 44 may visibly change to accommodate the new property (if applicable). The user may then select to accept the change, and the change is applied to the model object 46. The property editing module 40 allows the user to make a change to the property and optionally communicates the change with the property propagation module 42.

The process then optionally proceeds to step 314, which propagates the change to the parameter made for one object to all other instances of the object. For the sake of discussion, let's assume that the model object 46 is a footing model object 46. The various footing model objects 46 are defined as footings in the system 18. The footings may already be classified in the building domain, and information about the footings may be stored in the model object database 38. There are shared properties that are common to similar footings both in the same project 10 and across different projects 10. Both the type of footing and the given instance of the footing can have attributes and properties attached to them. Common information, like the maintenance instruction, model number, size, etc., may be attached to the type of footing. However, specific properties like serial number, installation date, condition, etc. may be assigned to the particular instance of the footing.

Therefore, when these generic type properties are assigned to particular model objects, editing the type property may be propagated by the property propagation module 42 to the other model objects 46 of the same type. However, in some other embodiments, the instance properties may not be propagated to the other model objects 46 of the same type.

The system 18 compares the properties of the model object 62 to identify newly added properties, modified properties, deleted properties, and/or unmodified properties. Additionally, in some embodiments, the propagation module 42 determines whether the properties are type or instance properties. The changes, additions, revisions, or deletions to the properties can be previewed. Thus, the system 18 advantageously allows users to identify deleted properties, newly added properties, modified properties, and unmodified properties all within the 3D user interface. The user may then approve the changes to the properties. If the user does not approve the revisions to the object properties, then the updated properties are not propagated. However, if the user does approve the revisions, the existing model properties are replaced with new properties (e.g., in the and automatically propagated to all instances of the model object (e.g., in the database 24) in accordance with the previously defined rules. Alternatively, some embodiments may not propagate the changes to model objects of the same type. Other embodiments may automatically propagate the changes to other model objects of the same type.

Figure 8A:
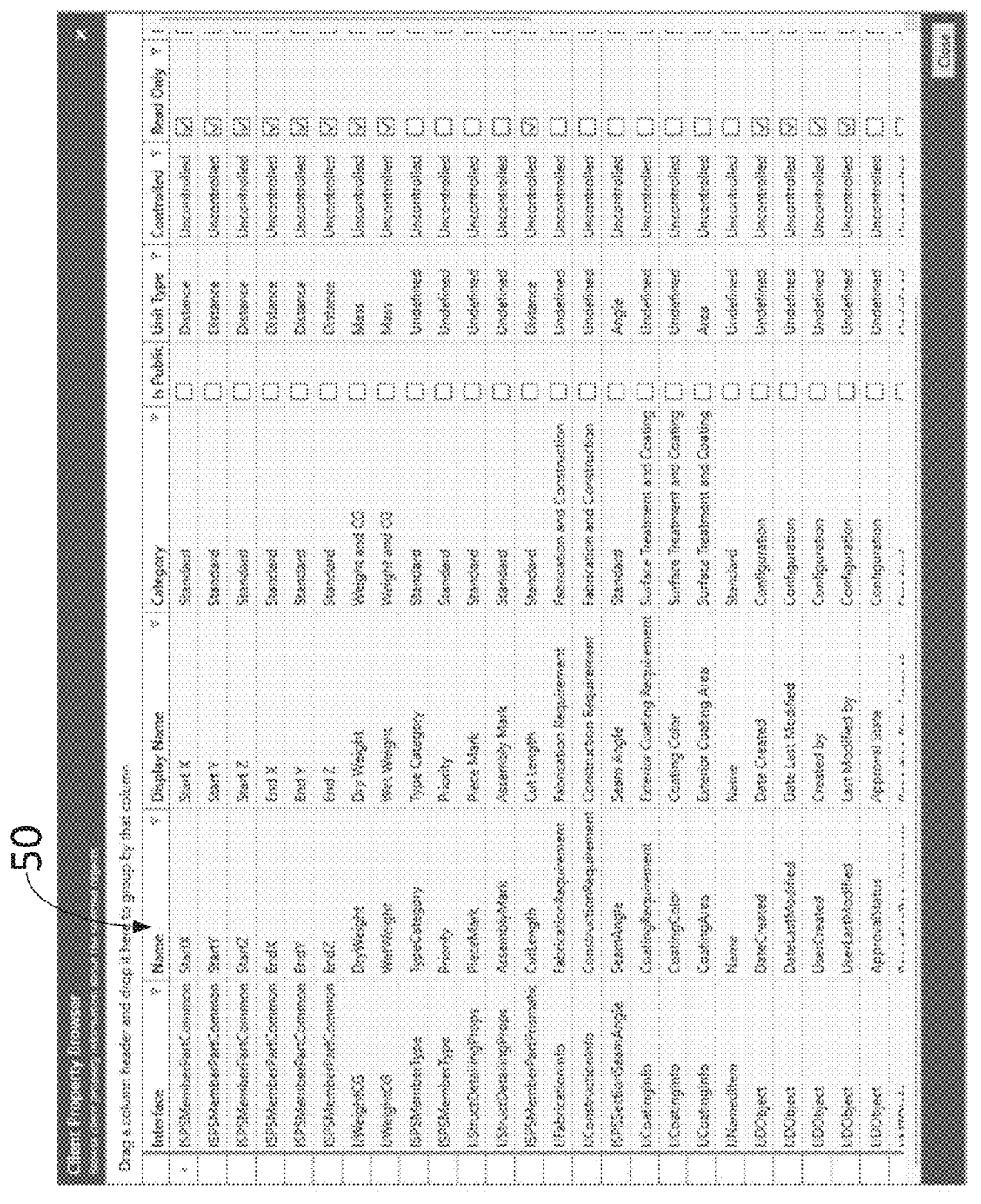
Figure 8B:
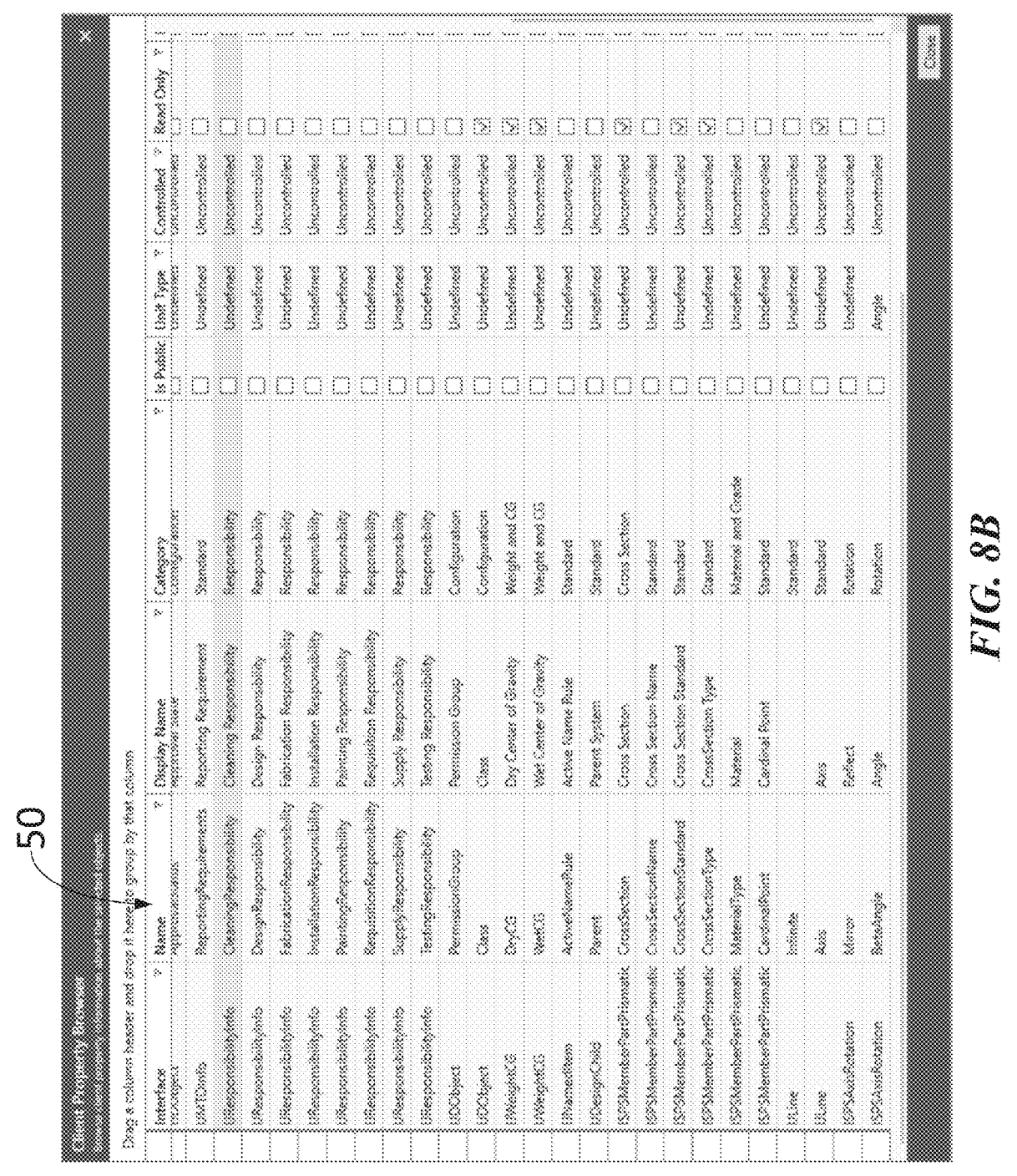

FIGS. 8A-8B schematically show a variety of different property 50 types. For example, FIG. 8B shows the cardinal point property as one of the property 50 options for columns and beams. As described previously, it is envisioned that illustrative embodiments may interact with thousands, and in many cases, tens of thousands of properties 50. The various chosen model object properties 50 may be populated in the graphical overlay 48.

Figure 9:
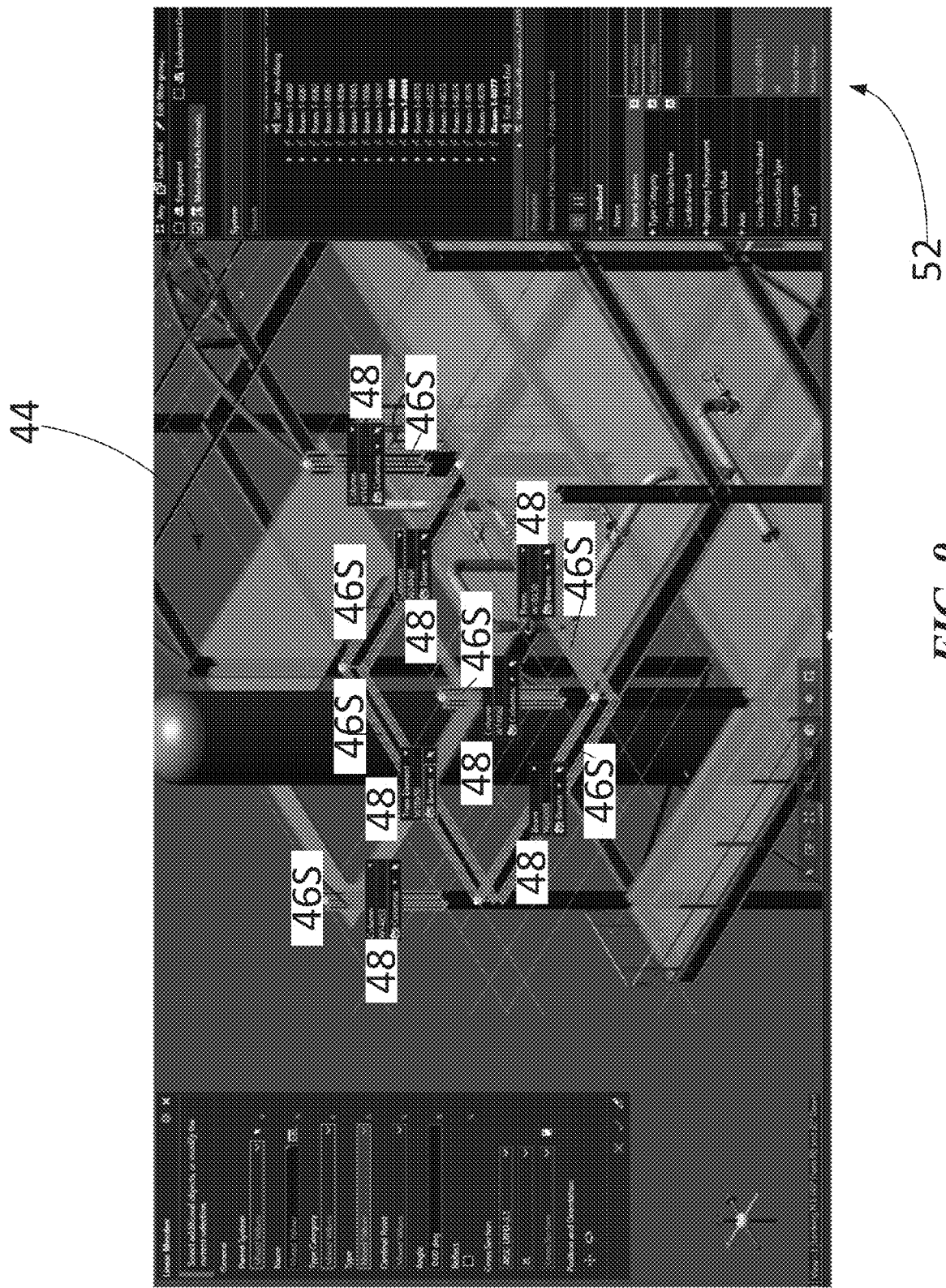
FIG. 9 shows a screenshot of a different 3D model where a plurality of properties are displayed in each of the graphical overlays in accordance with illustrative embodiments of the invention.

Although the above process is described with reference to editing a single property 50 of a single model object 46, it should be understood that the process may be expanded to cover viewing and editing multiple properties of model objects. For example, FIG. 9 shows a screenshot of a different 3D model 44 where a plurality of properties 50 are displayed in each of the graphical overlays 48. As shown, a plurality of properties 50 have been selected from the property selection window 52. Specifically, in this example, three properties have been selected (1) parent system, (2) type category, and (3) cross section name. The property selection module 38 instructs the graphical overlay engine 34 to display each of the selected three properties in each of the overlays 48 for each of the selected objects 46S.

Figure 10A:
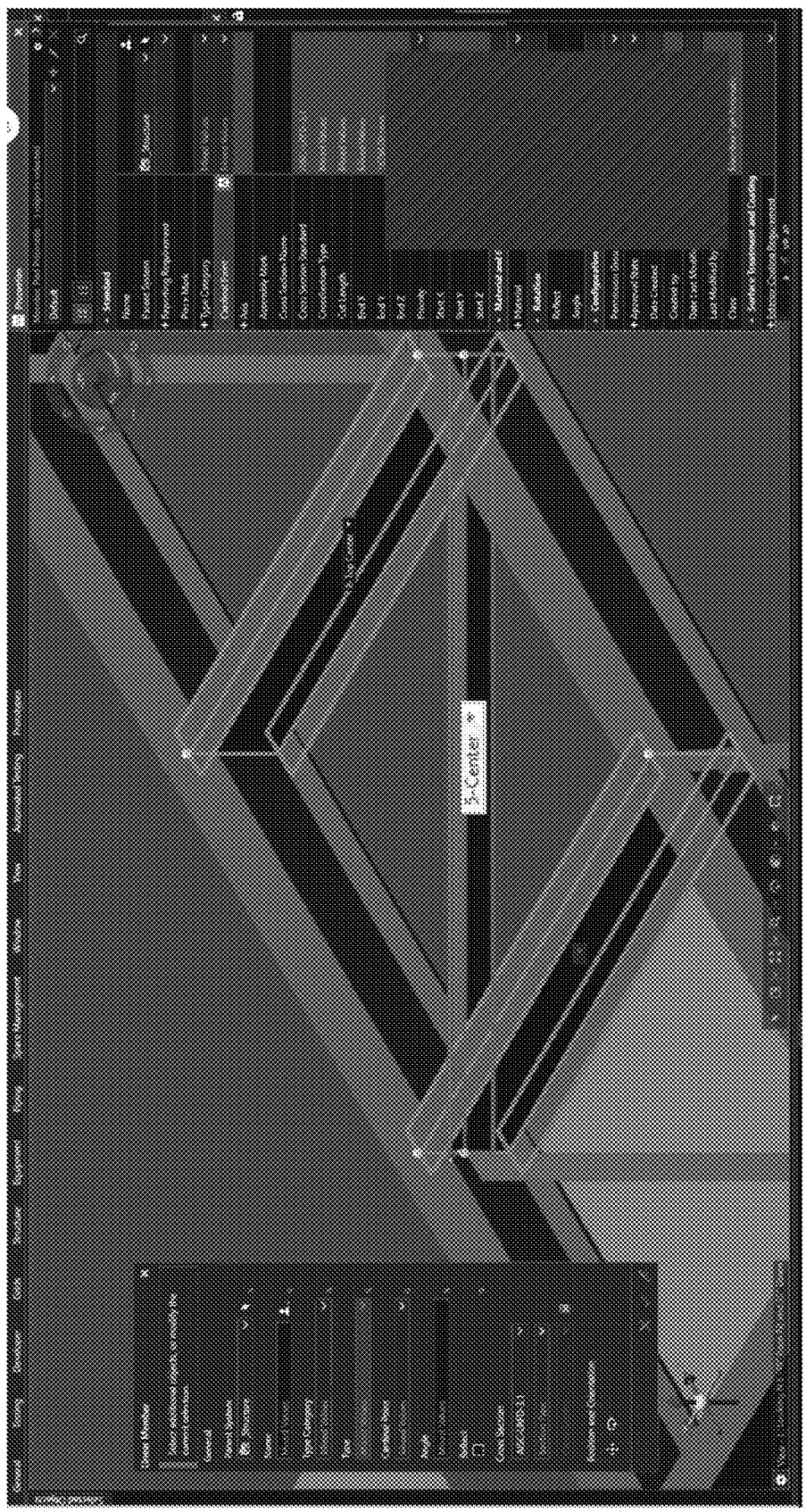
FIG. 10A shows a screenshot of a 3D model prior to changing a property in accordance with illustrative embodiments of the invention.
Figure 10B:
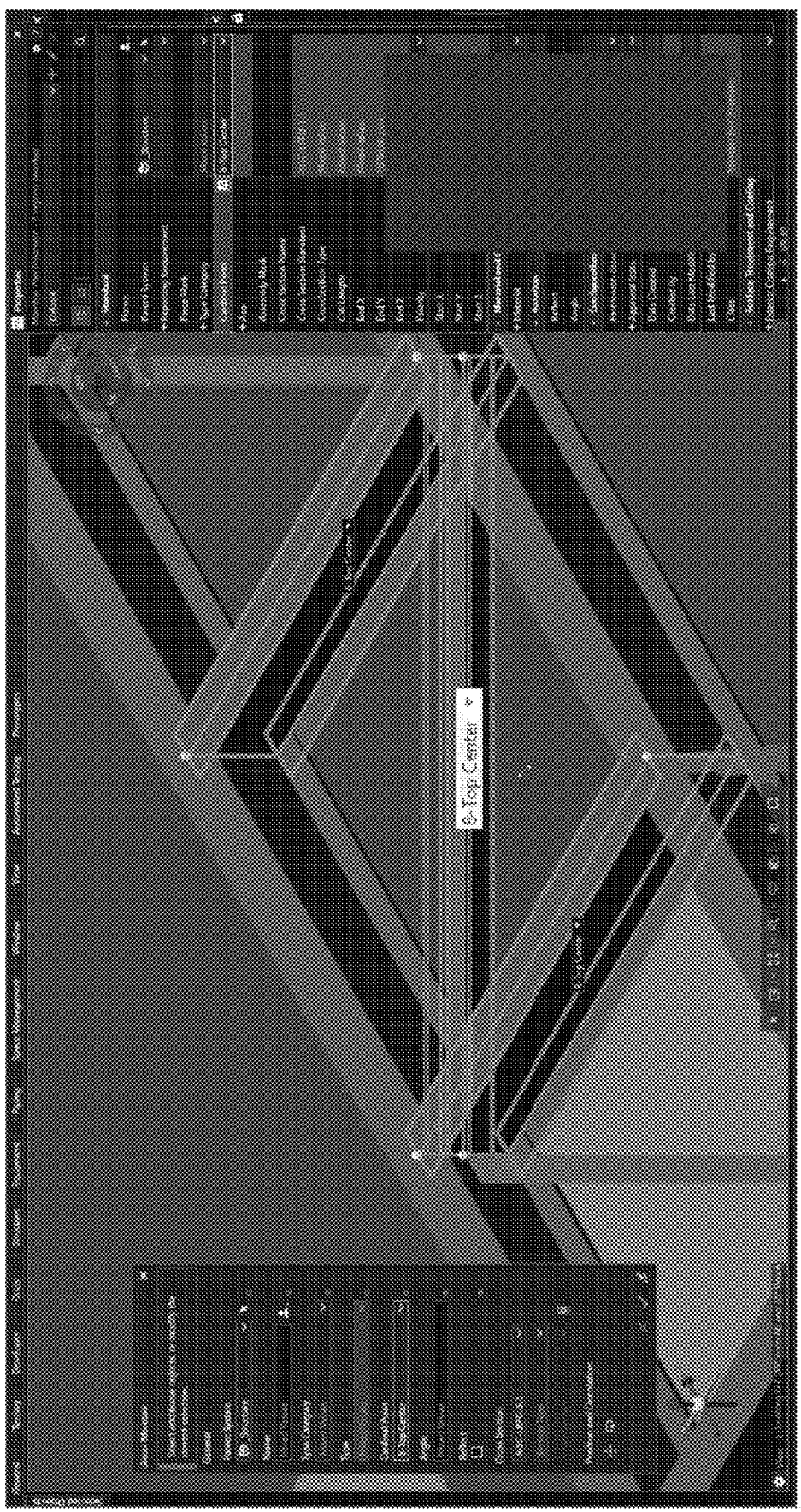
FIG. 10B shows a screenshot of the 3D model of FIG. 10A after changing a property in accordance with illustrative embodiments of the invention.

As described previously, editing some properties, such as cardinal point, may cause a visual change to the 3D model. FIG. 10A shows a screenshot of a 3D model prior to change cardinal point. In FIG. 10A, the center cross beam has a cardinal point value of "center." After adjusting the cardinal point to "top center," a visual change occurs to the model. FIG. 10B shows a screenshot of a 3D model showing a proposed change to the model object 46 after changing the cardinal point property of the model object. As shown, the new location of the center cross beam is shown in the 3D model. The user may visualize the change to the property, and then accept or deny the change. If the user accepts the change, then the model object is adjusted. If the user rejects the change, then the model object reverts to its original property and position.

Figure 11:
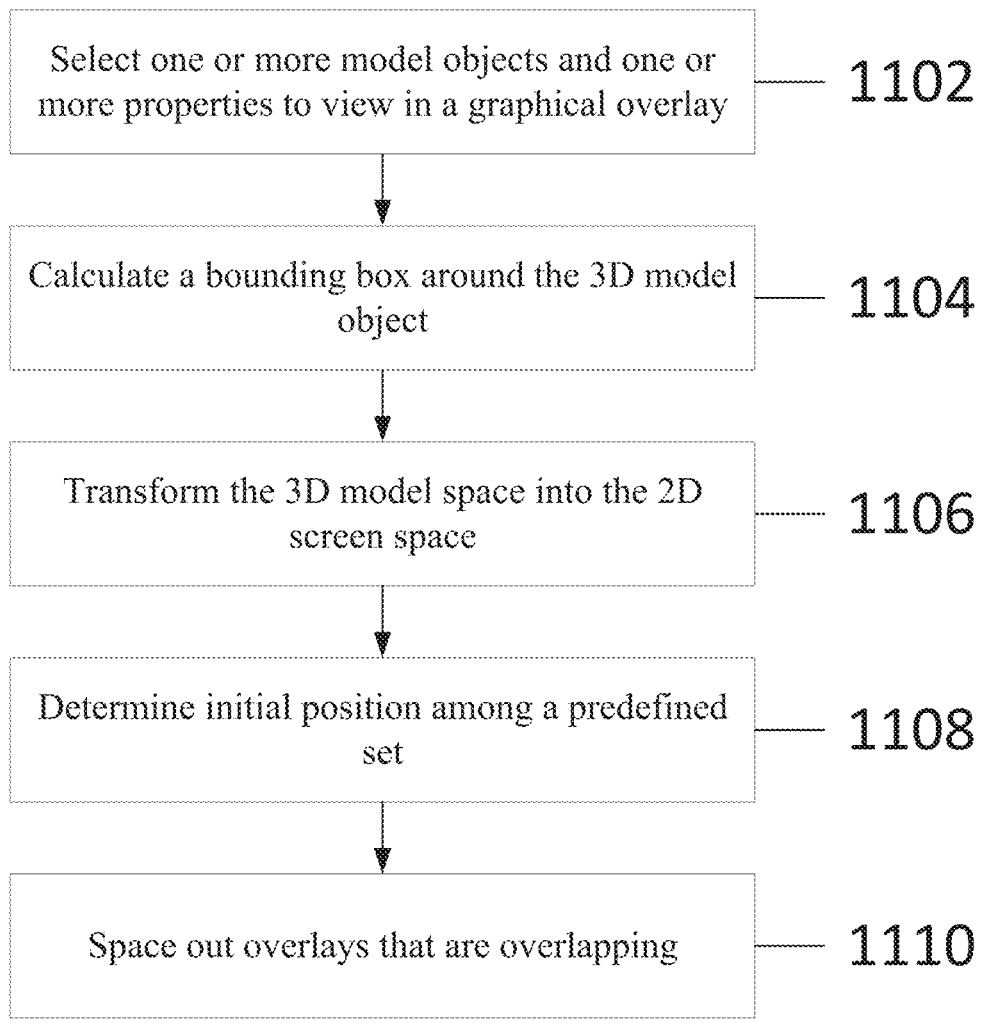
FIG. 11 shows a process of determining where to position the overlay relative to the model object in accordance with illustrative embodiments of the invention.

FIG. 11 shows a process of determining where to position the overlay 48 relative to the model object 46 in accordance with illustrative embodiments of the invention. It should be noted that this process can be a simplified version of a more complex process of determining where to position the overlay 48 relative to the model object 46. As such, the process may have additional steps that are not discussed. In addition, some steps may be optional, performed in a different order, or in parallel with each other. Accordingly, discussion of this process is illustrative and not intended to limit various embodiments of the invention.

The process begins at step 1102 which receives a selection of one or more model objects 46 and one or more properties to view in the graphical overlay 48. In some embodiments, step 1102 is substantially the same as steps 302-306 of FIG. 3, and therefore, discussion of step 1102 is not repeated here again.

Figure 12:
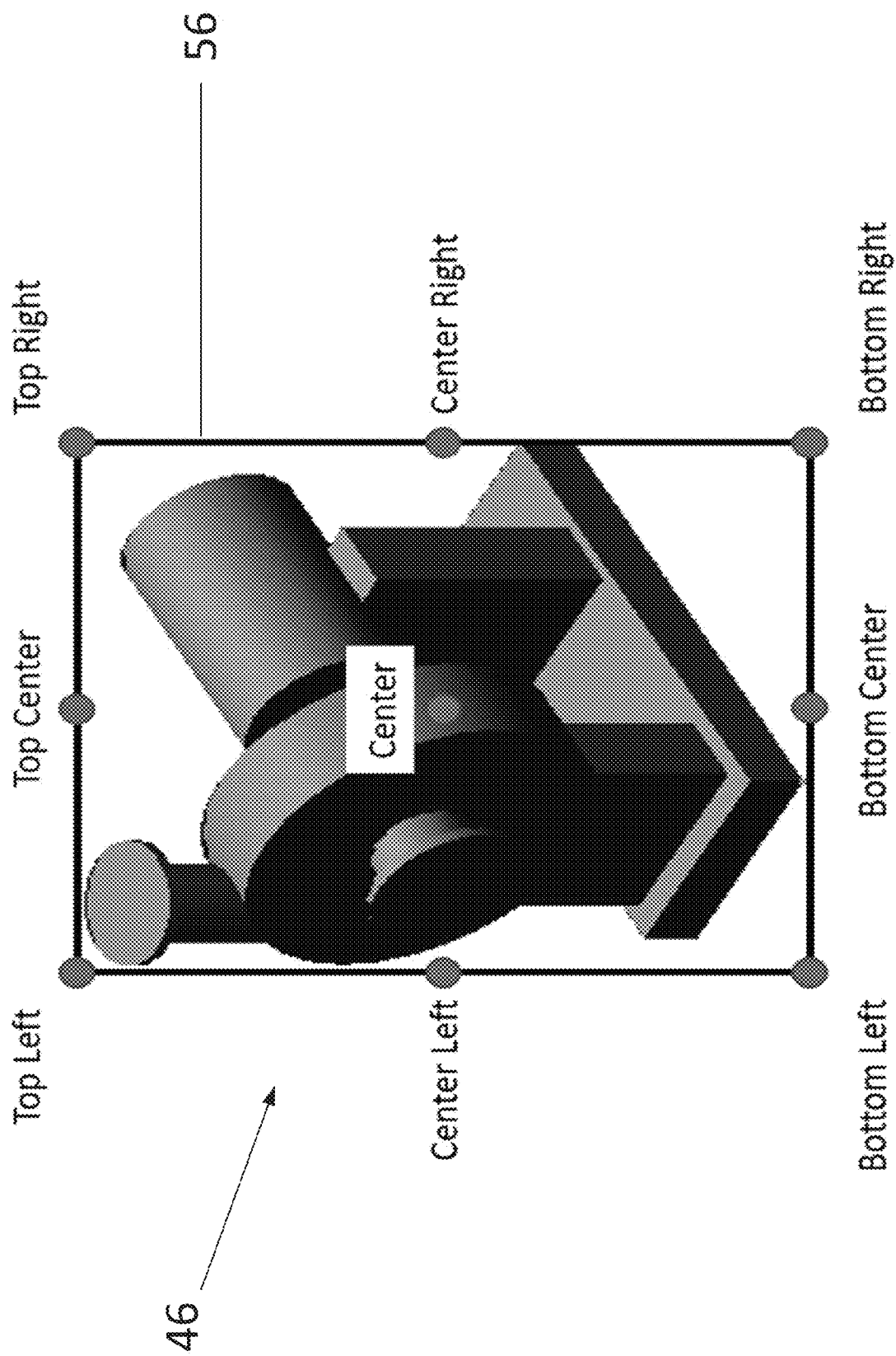
FIG. 12 schematically shows an example of a boundary of a model object used to determine a position of the overlay in accordance with illustrative embodiments of the invention

At step 1104, the graphical overlay engine 34 calculates a bounding box 56 around the 3D model object 46. FIG. 12 schematically shows an example of a model object 46 used to determine a position of the overlay 48 in accordance with illustrative embodiments of the invention. As shown in the figure, the bounding box 56 surrounds the model object 46. Although the bounding box 56 is shown as rectangular, in various embodiments, the bounding box 56 may take other shapes. Accordingly, in some embodiments, the bounding box 56 may be referred to merely as a boundary 56. Indeed, in some embodiments, the boundary 56 may track the shape of the object 46 from the presently viewed 3D perspective.

At step 1106, the graphical overlay engine 34 transforms the 3D model space into the 2D screen space. Accordingly, the boundary 56 may include and/or define a plurality of coordinate positions relative to the 2D space defined by the 3D model (e.g., coordinate positions such as top left, top center, top right, center left, center, center right, bottom left, bottom center, and bottom right). Indeed, many more coordinate positions other than those described here may be implemented (e.g., if the boundary 56 has a circular shape, the coordinate positions may additionally or alternatively include various angles around the circular boundary, such as in increments of 15 degrees from 0 degrees to 360 degrees).

At step 1108, the graphical overlay engine 34 may selected an initial position for the overlay 48 from among a predefined set. Thus, in some embodiments, the center coordinate position of the boundary 56 may be selected for the initial position of the overlay 48. Alternatively, any other coordinate position may be selected for the initial position (e.g., top left, top center, top right, center left, center right, bottom left, bottom center, and bottom right, etc.). Furthermore, illustrative embodiments may center, align left, and/or align right horizontally on the coordinate position. Additionally, or alternatively, illustrative embodiments may center, align top, or align bottom vertically on the coordinate position. The position for the overlay 48 may also be selected by a user input from the predefined set.

At step 1110, overlays 48 that are overlapping may be spaced out by the graphical overlay engine 34. For example, various embodiments may run a whitespace algorithm to space out the overlays 48 such that they are not overlapping. The whitespace algorithm may be a multi-step process in itself, as known to those of skill in the art. An example of the algorithm may generally follow these steps: Find the center C of the bounding box 56, for each rectangle R that overlaps another define a movement vector v, find all the rectangles R' that overlap R, add a vector to v proportional to the vector between the center of R and R', add a vector to v proportional to the vector between C and the center of R, move R by v, and repeat until none of the boundaries 56 overlap. Accordingly, the boundaries 56 are incrementally moved away from each other, and in this example, the center of all the rectangles. This loop eventually terminates because the component of v eventually spreads the boundaries 56 out enough so that they no longer overlap.

Optionally, the one or more overlays 48 may then be displayed. It should be understood that in some embodiments, the overlays 48 may be generated and then automatically moved so that they do not overlap. In some other embodiments, the position of the overlays 48 may be pre-calculated so that they do not overlap (e.g., as described above) prior to displaying the overlays 48 in the user interface.

Although parts of the above process are described with reference to a single model object 46, it should be understood that the process may be expanded to cover generating an overlay position for a plurality of model objects 46 (e.g., simultaneously).

It should be readily apparent to one of skill in the art that illustrative embodiments provide improvements in the functioning of a computer. As mentioned previously, prior art methods involved manually adjusting a property table for each of the model objects. In contrast, illustrative embodiments advantageously allow for viewing and editing properties of the model object within the 3D model itself, enabling an entirely new way of editing the model object properties for large-scale capital projects. Advantageously, users may now simultaneously visualize the properties of the plurality of selected model objects, visually confirm that the appropriate model object is being edited, and/or propagate those changes to the remainder of the model objects (e.g., if the changed property is a type property). Accordingly, illustrative embodiments provide improved efficiency and accuracy for computer design programs.

Various embodiments of the invention may be implemented at least in part in any conventional computer programming language. For example, some embodiments may be implemented in a procedural programming language (e.g., "C"), as a visual programming process, or in an object oriented programming language (e.g., "C++"). Additionally, or alternatively, some embodiments may be implemented using a combination of various programming languages, such as WPF, C#, C, and/or C++. Other embodiments of the invention may be implemented as a pre-configured, stand-alone hardware element and/or as preprogrammed hardware elements (e.g., application specific integrated circuits, FPGAs, and digital signal processors), or other related components.

In an alternative embodiment, the disclosed apparatus and methods (e.g., see the methods described above) may be implemented as a computer program product for use with a computer system. Such implementation may include a series of computer instructions fixed either on a tangible, non-transitory, non-transient medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). In fact, some embodiments may be implemented in a software-as-a-service model ("SAAS") or cloud computing model. Of course, some embodiments of the invention may be implemented as a combination of both software (e.g., a computer program product) and hardware. Still other embodiments of the invention are implemented as entirely hardware, or entirely software.

Although the above discussion discloses various exemplary embodiments of the invention, it should be apparent that those skilled in the art can make various modifications that will achieve some of the advantages of the invention without departing from the true scope of the invention.

What is claimed is:

1. A method of managing properties for model objects of a capital project, the method comprising:
receiving a selection of a model object;
receiving a selection of a type property of the selected model object to view in a graphical overlay, the type property being a property shared by a plurality of model objects of the capital project;
directing generation of the graphical overlay adjacent to the selected model object in a graphical user interface that displays a 3D model of the capital project, the graphical overlay including values for the selected type property;
receiving a modified type property value of the selected type property in the graphical overlay; and
propagating the modified type property value to a plurality of type property values corresponding to each of the plurality of model objects of the capital project.

2. The method as defined by claim 1, further comprising:
receiving a selection of additional properties to view after displaying the graphical overlay; and
displaying, in response to receiving the selection of additional properties, the additional properties in the graphical overlay.

3. The method as defined by claim 1, wherein the graphical overlay may be moved to a different location within the 3D model by a user input.

4. The method as defined by claim 1, further comprising displaying a plurality of graphical overlays, wherein a respective graphical overlay is displayed for each of a plurality of selected model objects.

5. The method as defined by claim 4, further comprising spacing out one or more of the plurality of graphical overlays so that they do not overlap.

6. The method as defined by claim 1, wherein
the selected model object is selected by a first user input in the 3D model, and
the selected type property of the selected model object to display in the graphical overlay is made by a second user input in a property selection window.

7. The method as defined by claim 6, wherein the property selection window is outside of the 3D model window.

8. The method as defined by claim 6, wherein the selected type property displayed in the graphical overlay is a function of selecting the type property in the property selection window.

9. The method as defined by claim 6, further comprising displaying a plurality of graphical overlays, wherein a respective graphical overlay is displayed for each of a plurality of selected model objects, wherein each one of the plurality of graphical overlays takes up a smaller amount of 2D area of the 3D model than the property selection window.

10. The method as defined by claim 6, wherein the graphical overlay only displays selected properties from the property selection window.

11. A system for editing properties of model objects in a graphical user interface, the system comprising:
at least one processing device; and
at least one memory device configured to store a set of instructions, which when executed by the at least one processing device, is configured to:
communicate with a model object database that contains information relating to a plurality of model objects of a three-dimensional model representing a capital project, the information including at least one model object property for each of the plurality of model objects,
direct the graphical user interface to display the plurality of model objects of the three-dimensional model,
receive a selection of a first model object of the plurality of model objects and a type property corresponding to the first model object and a subset of the plurality of model objects,
generate a graphical overlay in the three-dimensional model, the graphical overlay being positioned over or adjacent to the first model object, the graphical overlay including a type property value for the selected type property, wherein the type property value is directly editable in the graphical overlay,
receive a modified type property value in the graphical overlay, and
propagate the modified type property value to the information relating to the subset of the plurality of model objects in the model object database.

12. The system as defined by claim 11, wherein the system is configured to generate a plurality of graphical overlays, each of the plurality of graphical overlays associated with one of a subset of selected model objects.

13. The system as defined by claim 11, further comprising a property selection window that receives the selection of the type property to display.

14. The system as defined by claim 13, wherein the system adjusts one or more model object properties displayed as a function of receiving the selection of the first model object.

15. The system as defined by claim 11, wherein the selection of the first model object is configured to be made via a user selection in the three-dimensional model.

16. A computer program product for use on a computer system for editing properties of model objects in a three-dimensional model, the computer program product comprising a tangible, non-transient computer usable medium having computer readable program code thereon, the computer readable program code comprising:

program code for displaying a 3D model of a capital project in a graphical user interface, the 3D model having a plurality of model objects;

program code for receiving a selection of a model object in the graphical user interface;

program code for receiving a selection of a type property of the selected model object to view in a graphical overlay, the type property being shared by a subset of the plurality of model objects;

program code for displaying the graphical overlay over or adjacent to the selected model object in the 3D model, the graphical overlay including a type property value off the selected type property;

program code for modifying the type property value of the selected type property using the graphical overlay; and program code for propagating the modified type property value to a plurality of type property values corresponding to the subset of the plurality of model objects stored in a model object database.

17. The computer program product as defined by claim 16, further comprising:

program code for selecting additional properties to view after displaying the graphical overlay; and program code for visually displaying, in response to selecting additional properties, the additional properties in the graphical overlay.

18. The computer program product as defined by claim 16, further comprising:

program code for allowing a user input to move the graphical overlay to a different location within the 3D model.

19. The computer program product as defined by claim 16, further comprising:

program code for displaying a plurality of graphical overlays, wherein a respective graphical overlay is displayed for each of a plurality of selected objects.

20. The computer program product as defined by claim 16, further comprising:

program code for displaying, in the graphical overlay, the type property selected from a property selection window.

* * * * *

UNITED STATES PATENT AND TRADEMARK OFFICE
CERTIFICATE OF CORRECTION

PATENT NO. : 11,592,954 B2
APPLICATION NO. : 17/078974
DATED : February 28, 2023
INVENTOR(S) : Christian List It is certified that error appears in the above-identified patent and that said Letters Patent is hereby corrected as shown below:

In the Claims

At Column 15, Claim number 16, Line number 26, please replace "off" with --of--

Signed and Sealed this
Twenty-fifth Day of April, 2023

Katherine Kelly Vidal
*Director of the United States Patent and Trademark Office*